United States Patent
Ta

(10) Patent No.: US 6,940,728 B2
(45) Date of Patent: Sep. 6, 2005

(54) CIRCUIT BOARD RETAINING BRACKETS

(75) Inventor: Peter Cuong Dac Ta, Hayward, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 25 days.

(21) Appl. No.: 10/449,329

(22) Filed: May 29, 2003

(65) Prior Publication Data

US 2003/0173315 A1 Sep. 18, 2003

Related U.S. Application Data

(62) Division of application No. 09/662,225, filed on Sep. 14, 2000, now Pat. No. 6,618,262.

(51) Int. Cl.[7] .............................. H05K 5/00; H05K 5/04; H05K 5/06
(52) U.S. Cl. ........................ 361/759; 361/756; 361/801
(58) Field of Search ................................ 361/752–759, 361/796–802; 312/223.1, 223.2; 248/200.1, 222.11, 222.14, 581, 683

(56) References Cited

U.S. PATENT DOCUMENTS

| | | | |
|---|---|---|---|
| 5,077,638 A | 12/1991 | Andersson et al. | 361/388 |
| 5,566,049 A | 10/1996 | Nguyen | 361/685 |
| 5,575,546 A | 11/1996 | Radloff | 312/183 |
| 5,906,497 A * | 5/1999 | Pham et al. | 439/160 |
| 6,249,441 B1 * | 6/2001 | Barbier et al. | 361/796 |
| 6,317,318 B1 | 11/2001 | Kim | 361/685 |
| 6,700,791 B1 * | 3/2004 | Zappacosta | 361/759 |

* cited by examiner

*Primary Examiner*—Kamand Cuneo
*Assistant Examiner*—Tuan Dinh
(74) *Attorney, Agent, or Firm*—Gunnison, McKay & Hodgson, L.L.P.; Serge J. Hodgson

(57) ABSTRACT

A mother board retaining bracket is mounted to an outer circuit board housing and supports an edge of a mother board. The mother board retaining bracket prevents the mother board from moving, e.g., during transportation, and prevents the associated failure of the computer system. The computer system further includes single and double locker belt retaining brackets. The single locker belt retaining bracket extends across a retaining clip on one side of a circuit board and locks the retaining clip in place. The double locker belt retaining bracket extends across retaining clips on both sides of a circuit board and locks the retaining clips in place. In this manner, the single and double locker belt retaining brackets prevent the retaining clips from becoming shook loose.

10 Claims, 9 Drawing Sheets

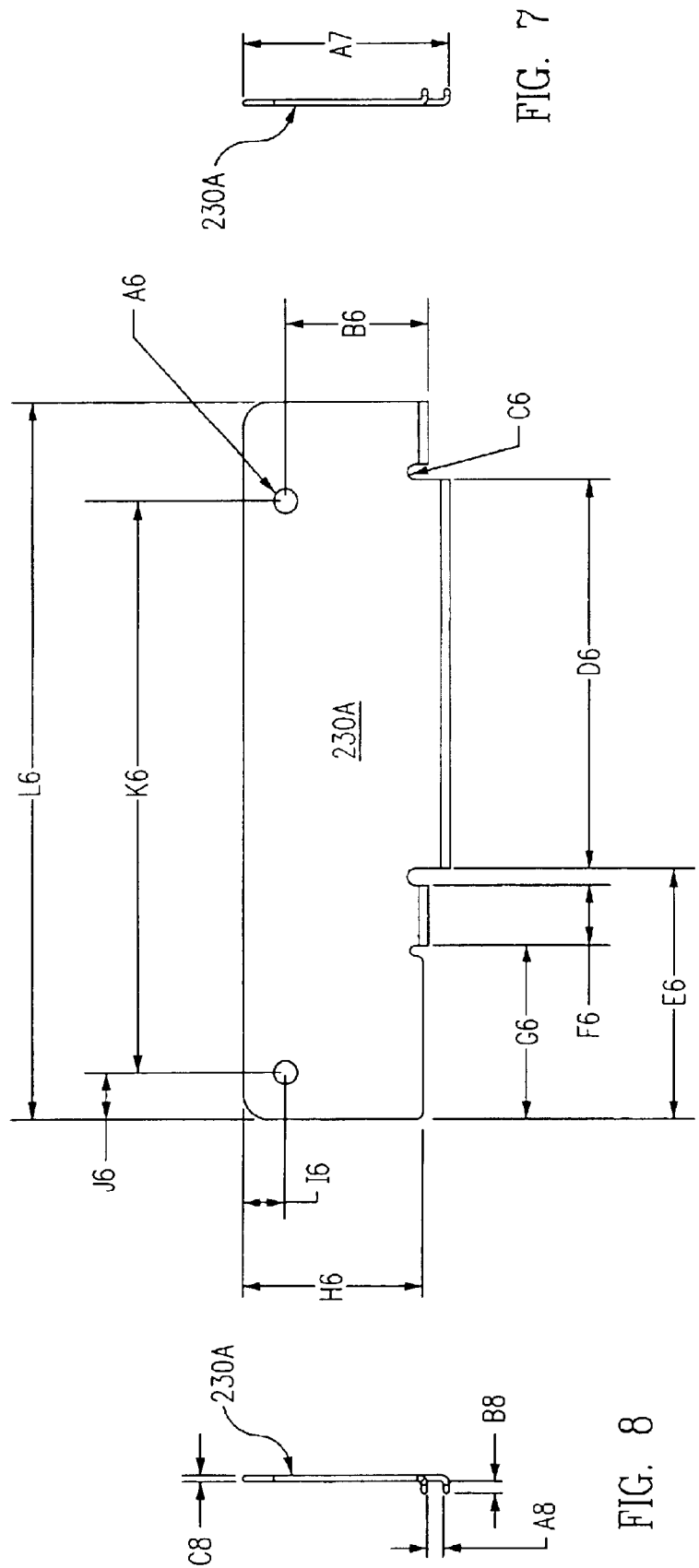

CIRCUIT BOARD RETAINING BRACKETS

This application is a divisional of U.S. patent application Ser. No. 09/662,225, entitled "CIRCUIT BOARD RETAINING BRACKETS", filed on Sep. 14, 2000 now U.S. Pat. No. 6,618,262.

BACKGROUND OF THE INVENTION

1. Field of the Invention

The present invention relates generally to retaining brackets for use in electronic devices. More particularly, the present invention relates to brackets for retaining circuit boards.

2. Description of the Related Art

Computer systems are generally sensitive to shock and vibration. Inevitably, computer systems are shipped to an end-user and, during this shipment, the computer systems are exposed to substantial shock and vibration. This shock and vibration can cause the computer system to fail.

FIG. 1 is a side plan view of a computer system 10 having a circuit board 12 attached to a mother board 14 in accordance with the prior art. As shown FIG. 1, mother board 14 included a socket 16, and circuit board 12 fit into socket 16 in a well known manner. Of importance, use of socket 16 allowed circuit board 12 to be readily removed from mother board 14 for replacement or repair.

To remove circuit board 12, retaining clips 18, which were pivotably attached to circuit board 12, were moved from a lock position L to an unlocked position U (indicated in dashed lines). This caused retaining clips 18 to become disengaged from locking beams 20. Circuit board 12 was then slid from socket 16 and removed from mother board 14.

Disadvantageously, shock and vibration, e.g., during transportation, sometimes caused retaining clips 18 to become shook loose. Once loose, retaining clips 18 became disengage from locking beams 20 and circuit board 12 was free to move. Undesirably, circuit board 12 slid out of socket 16 as indicated by arrow 22 causing failure of computer system 10.

Even if retaining clips 18 were not shook loose, shock and vibration, e.g., during transportation, caused mother board 14 to bend and move away from circuit board 12 as indicated by arrow 24. Again, circuit board 12 undesirably slid out of socket 16 causing failure of computer system 10.

In any event, decoupling of circuit board 12 from socket 16 caused failure of computer system 10. However, to maintain customer satisfaction and to minimize service cost associated with computer system 10, is important to prevent failure of computer system 10.

SUMMARY OF THE INVENTION

In accordance with the present invention, a mother board retaining bracket is mounted to an outer circuit board housing and supports an edge of a mother board. In this manner, the mother board retaining bracket prevents the mother board from moving, e.g., during transportation, and prevents the associated failure of the computer system.

In one particular embodiment, the mother board retaining bracket includes a body having a mounting aperture, one or more upper tabs extending perpendicularly from the body, and one or more lower tabs extending perpendicularly from the body. The upper tabs lie in a first plane and the lower tabs lie in a second plane spaced apart from the first plane. The upper tabs, the lower tabs, and the body define a slot, and the edge of the mother board is supported in the slot.

A method of supporting the mother board includes defining a slot by the upper tabs, the body, and the lower tabs of the mother board retaining bracket. An edge of the mother board is slid into the slot. The body of the mother board retaining bracket is mounted to a circuit board housing.

The computer system further includes a single locker belt retaining bracket. The single locker belt retaining bracket extends across retaining clips at one end of circuit boards and thus locks the retaining clips and circuit boards in place. In this manner, the single locker belt retaining bracket prevents the retaining clips from becoming shook loose, e.g., during transportation, and prevents the associated failure of the computer system.

In one particular embodiment, the single locker belt retaining bracket includes an arm and a first extension attached to a first end of the arm. The first extension includes a mounting aperture. A first end of a second extension is attached to a second end of the arm. A tab is attached to a second end of the second extension.

To lock a retaining clip in place with the arm of the single locker belt retaining bracket, the tab is located in a slot of a first circuit board housing. A screw is passed through the mounting aperture in the first extension. The screw is threaded into a threaded structure in or adjacent a second circuit board housing. This causes the arm of the single locker belt retaining bracket to contact the retaining clip and lock it in place.

The computer system also includes a double locker belt retaining bracket. The double locker belt retaining bracket extends across retaining clips at both ends of circuit boards and thus locks the retaining clips and circuit boards in place. In this manner, the double locker belt retaining bracket prevents the retaining clips from becoming shook loose, e.g., during transportation, and prevents the associated failure of the computer system.

In one particular embodiment, the double locker belt retaining bracket includes a body and a first extension attached to a first end of the body. The first extension includes a mounting aperture. A first end of a second extension is attached to a second end of the body. A second end of the second extension includes a first protrusion and a second protrusion.

To mount the double locker belt retaining bracket to a first circuit board housing and a second circuit board housing, a first mounting stud and a second mounting stud are attached to the first circuit board housing. The first protrusion of the double locker belt retaining bracket is passed around the first mounting stud.

The double locker belt retaining bracket is slid towards the first mounting stud. This allows the second protrusion to be passed around the second mounting stud. The double locker belt retaining bracket is slid towards the second mounting stud. This causes a first lip defined by the first protrusion to engage the first mounting stud and also causes a second lip defined by the second protrusion to engage the second mounting stud.

A screw is passed through the mounting aperture of the first extension. The screw is threaded into a threaded structure in or adjacent the second circuit board housing.

These and other features and advantages of the present invention will be more readily apparent from the detailed description set forth below taken in conjunction with the accompanying drawings.

BRIEF DESCRIPTION OF THE DRAWINGS

FIG. 6 is a front plan view of the mother board retaining bracket of FIG. 3.

FIGS. 7 and 8 are side plan views of the mother board retaining bracket of FIG. 6.

In the following description, the same or similar elements are labeled with the same or similar reference numbers.

DETAILED DESCRIPTION

Figure 1:
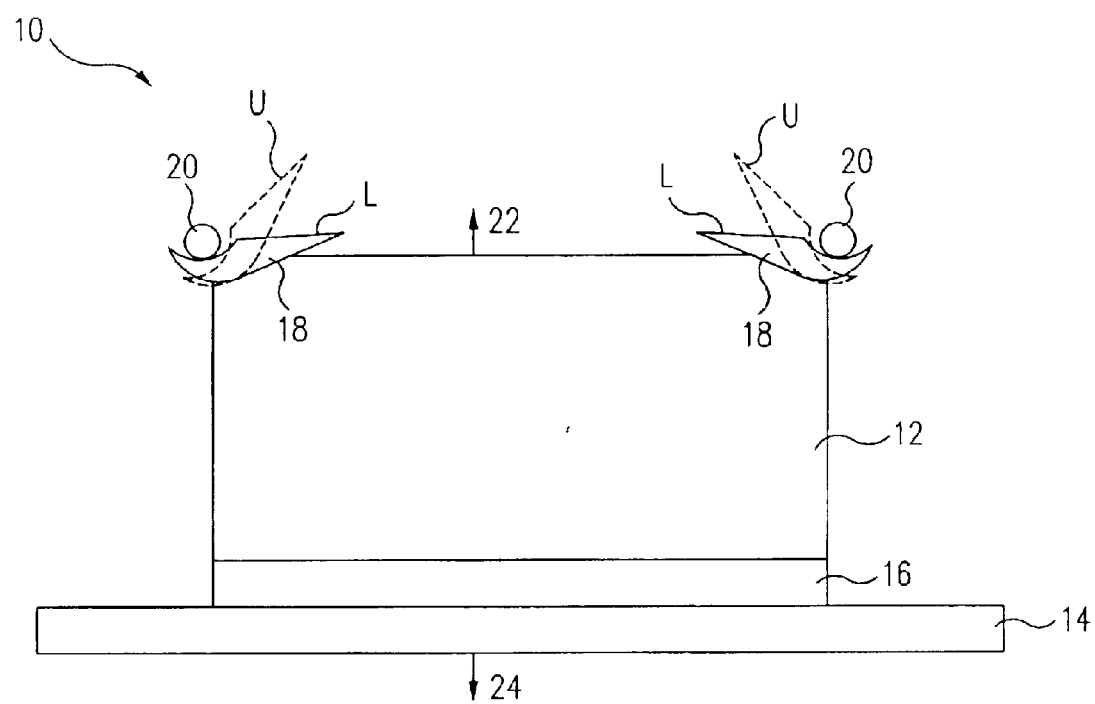
FIG. 1 is a side plan view of a computer system having a circuit board attached to a mother board in accordance with the prior art.

In accordance with the present invention, a mother board retaining bracket 230 (FIG. 2) is mounted to an outer circuit board housing 232 and supports an edge 214E of a mother board 214. In this manner, mother board retaining bracket 230 prevents mother board 214 from moving, e.g., during transportation, and prevents the associated failure of computer system 200.

Computer system 200 further includes a single locker belt retaining bracket 250A. Single locker belt retaining bracket 250A extends across retaining clips 218A, 218B and thus locks retaining clips 218A, 218B in place. In this manner, single locker belt retaining bracket 250A prevents retaining clips 218A, 218B from becoming shook loose, e.g., during transportation, and prevents the associated failure of computer system 200.

Computer system 200 also includes a double locker belt retaining bracket 270. Double locker belt retaining bracket 270 extends across retaining clips 218E, 218F, 218G, 218H and thus locks retaining clips 218E, 218F, 218G, 218H in place. In this manner, double locker belt retaining bracket 270 prevents retaining clips 218E, 218F, 218G, 218H from becoming shook loose, e.g., during transportation, and prevents the associated failure of computer system 200.

Figure 2:
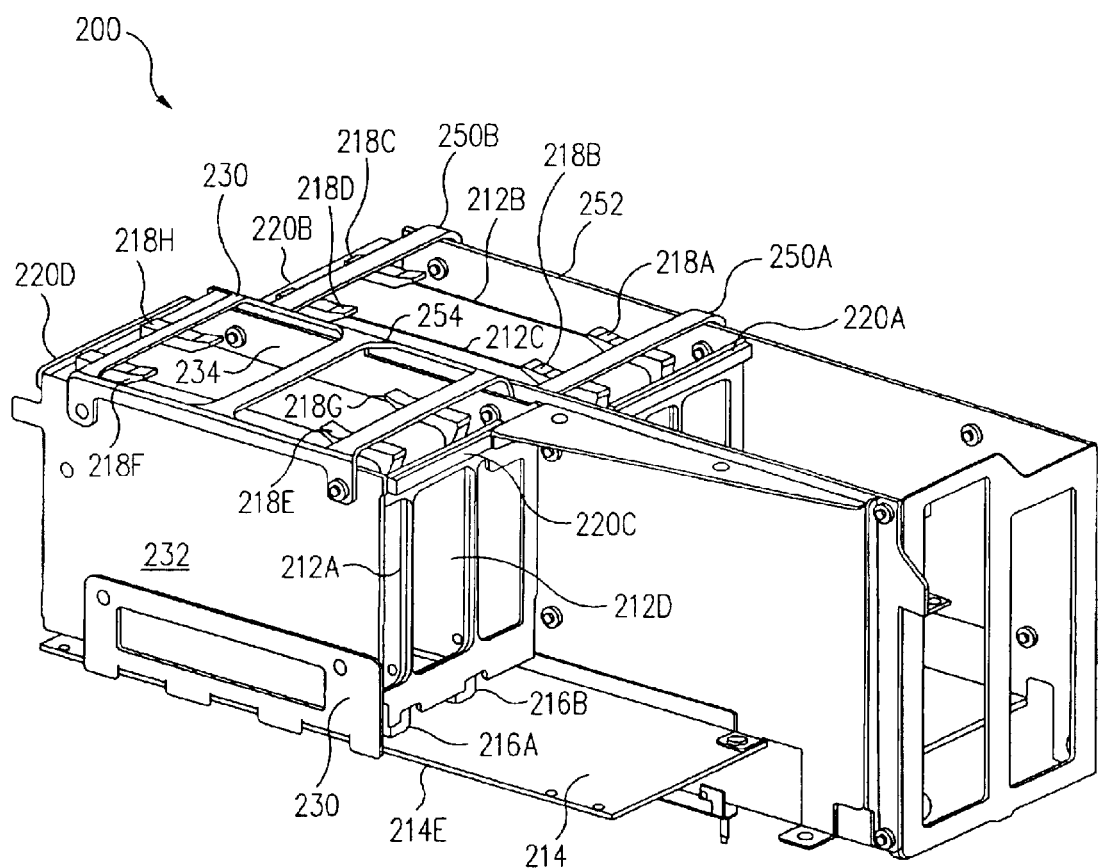
FIG. 2 is a perspective view of a computer system having retaining brackets in accordance with one embodiment of the present invention.

More particularly, FIG. 2 is a perspective view of a computer system 200 having retaining brackets 230, 250A, 250B, and 270 in accordance with one embodiment of the present invention. Computer system 200 includes a mother board 214. Mother board 214 includes a first socket 216A in a conventional manner. A circuit board 212A, perpendicular to mother board 214, is mounted in socket 216A as those of skill in the art will unerstand.

In accordance with this embodiment, an outer circuit board housing 232 is adjacent circuit board 212A. Outer circuit board housing 232 is parallel to circuit board 212A and perpendicular to mother board 214. Retaining bracket 230, hereinafter referred to as a mother board retaining bracket 230, is mounted to outer circuit board housing 232 and supports an edge 214E of mother board 214. As discussed below in greater detail with reference to FIGS. 3, 4, and 5, mother board retaining bracket 230 supports mother board 214 and prevents undesirable movement of mother board 214 away from circuit board 212A and prevents the associated failure of computer system 200.

Computer system 200 further includes a second circuit board 212B and a third circuit board 212C. Circuit board 212B includes a retaining clip 218A and circuit board 212C includes a retaining clip 218B. Circuit boards 212B, 212C are mounted in sockets on a mother board (not shown in the view of FIG. 2, see FIG. 10). Retaining clips 218A, 218B are engaged with a locking beam 220A thus holding circuit boards 212B, 212C in place.

Circuit boards 212B, 212C are contained within an enclosure defined by an outer circuit board housing 252 and an inner circuit board housing 254. To prevent retaining clips 218A, 218B from becoming shook loose, e.g., during transportation, retaining bracket 250A, hereinafter referred to as a single locker belt retaining bracket 250A, is mounted to circuit board housings 252, 254. Single locker belt retaining bracket 250A extends from outer circuit board housing 252 across retaining clips 218A, 218B and to inner circuit board housing 254. As discussed in greater detail below with reference to FIGS. 9 and 10, single locker belt retaining bracket 250A locks retaining clips 218A, 218B in place and prevents retaining clips 218A, 218B from becoming shook loose, e.g., during transportation.

Circuit board 212B further includes a retaining clip 218C and circuit board 212C further includes a retaining clip 218D. Retaining clips 218C, 218D are engaged with a locking beam 220B thus holding circuit boards 212B, 212C in place. In a manner similar to that described above with respect to single locker belt retaining bracket 250A, retaining bracket 250B, hereinafter referred to as a single locker belt retaining bracket 250B, extends from outer circuit board housing 252 across retaining clips 218C, 218D and to inner circuit board housing 254. By extending across retaining clips 218C, 218D, single locker belt retaining bracket 250B locks retaining clips 218C, 218D in place and prevents retaining clips 218C, 218D from becoming shook loose, e.g., during transportation.

Computer system 200 further includes a circuit board 212D adjacent circuit board 212A. Circuit board 212D is mounted in a socket 216B of mother board 214 in a manner similar to that discussed above in regards to circuit board 212A and socket 216A.

Circuit board 212A includes retaining clips 218E, 218F and circuit board 212D includes retaining clips 218G, 218H. Retaining clips 218E, 218G and retaining clips 218F, 218H are engaged with locking beams 220C, 220D, respectively, thus holding circuit boards 212A, 212D in place.

Circuit boards 212A, 212D are contained within an enclosure defined by outer circuit board housing 232 and an inner circuit board housing 234. To prevent retaining clips 218E, 218F, 218G, 218H from becoming shook loose, e.g., during transportation, a retaining bracket 270, hereinafter referred to as a double locker belt retaining bracket 270, is mounted to circuit board housings 232, 234. Double locker belt retaining bracket 270 extends from outer circuit board housing 232 across retaining clips 218E, 218F, 218G, 218H and to inner circuit board housing 234. As discussed in greater detail below with reference to FIGS. 11, 12 and 13, double locker belt retaining bracket 270 locks retaining clips 218E, 218F, 218G, 218H in place and prevents retaining clips 218E, 218F, 218G, 218H from becoming shook loose, e.g., during transportation.

Figure 3:
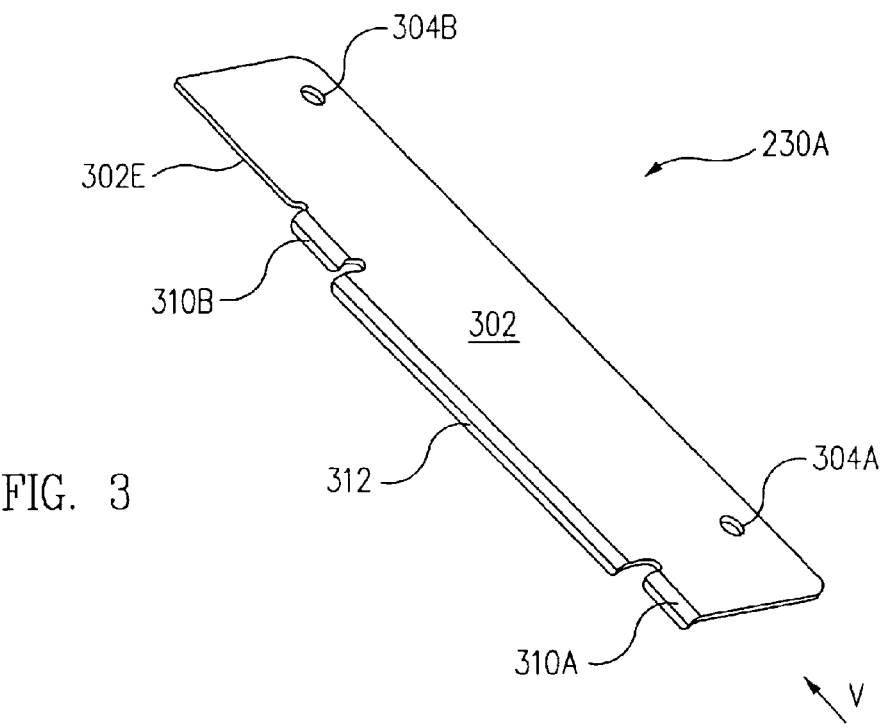
FIG. 3 is a rear perspective view of a mother board retaining bracket in accordance with one embodiment of the present invention.

FIG. 3 is a rear perspective view of a mother board retaining bracket 230A in accordance with one embodiment of the present invention. Mother board retaining bracket 230A includes a body 302, which is planar. Body 302 includes a first mounting aperture 304A and a second mounting aperture 304B, collectively referred to as mounting apertures 304.

Mother board retaining bracket 230A includes at least one upper, e.g., first, tab 310 and, more particularly, includes upper tabs 310A and 310B, collectively referred to as upper tabs 310. Mother board retaining bracket 230A further includes at least one lower, e.g., second, tab 312. Upper tabs 310 and lower tab 312 are formed along a lower, e.g., first, edge 302E of body 302. In this embodiment, upper tabs 310 and lower tab 312 extend perpendicularly from body 302.

Figure 4:
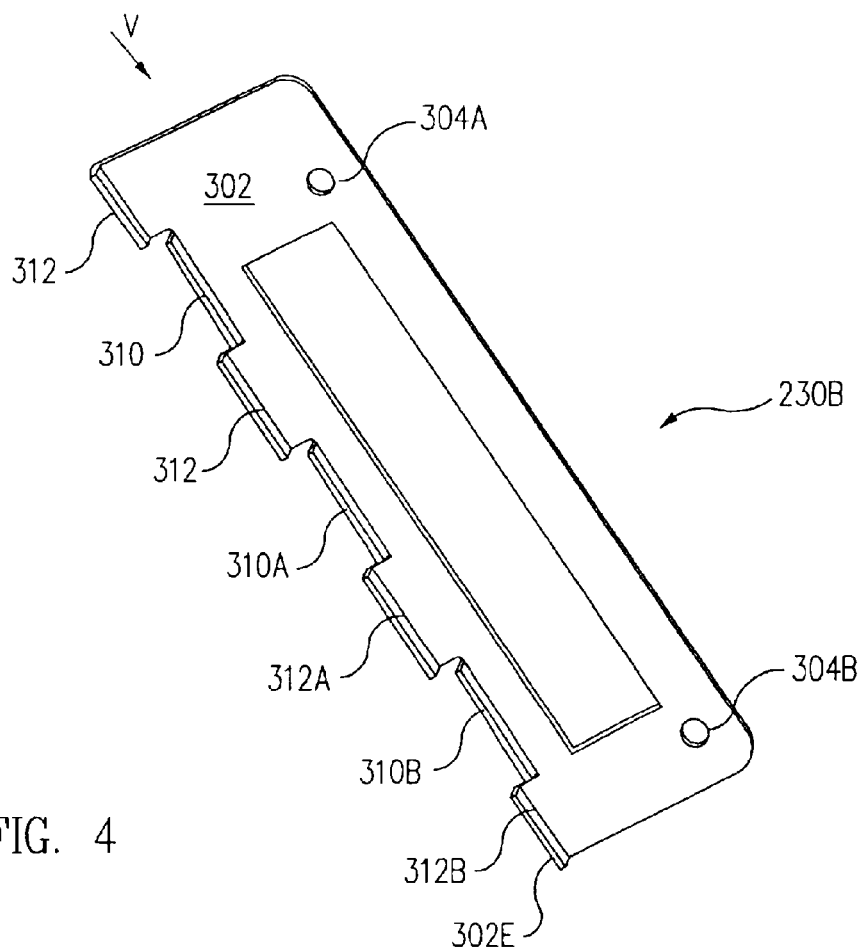
FIG. 4 is a front perspective view of a mother board retaining bracket in accordance with an alternative embodiment of the present invention.

FIG. 4 is a front perspective view of a mother board retaining bracket 230B in accordance with an alternative embodiment of the present invention. Mother board retaining bracket 230B of FIG. 4 is similar to mother board retaining bracket 230A of FIG. 3 and only the significant differences are discussed below.

Referring now to FIG. 4, mother board retaining bracket 230B includes a plurality of upper tabs 310 interleaved with a plurality of lower tabs 312. More particularly, between each adjacent upper tab 310 is a lower tab 312 and vice versa. To illustrate, the plurality of upper tabs 310 include upper tabs 310A, 310B and the plurality of lower tabs 312 include lower tabs 312A, 312B. Lower tab 312A is between upper tab 310A and upper tab 310B in the longwise, e.g., first, direction in the view of FIG. 4. Similarly, upper tab 310B is between lower tab 312A and lower tab 312B.

Figure 5:
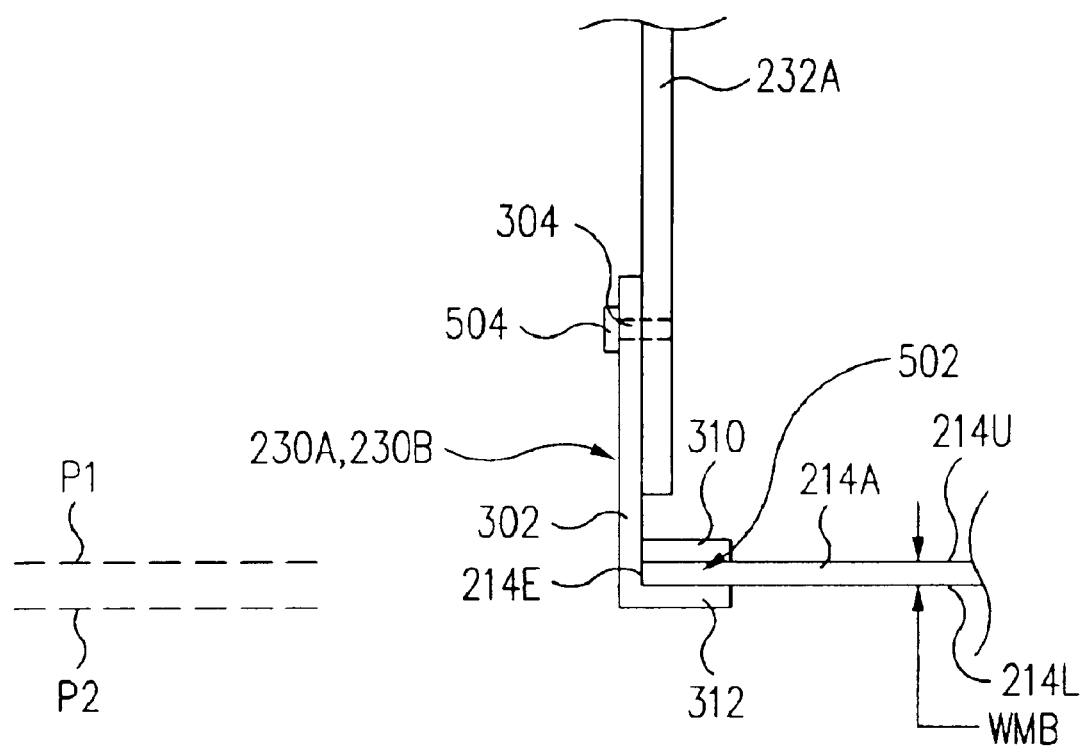
FIG. 5 is a side plan view of the mother board retaining bracket along the line V of FIG. 3 or 4 mounted to a mother board in accordance with one embodiment of the present invention.

FIG. 5 is a side plan view of mother board retaining bracket 230A or 230B along the line V of FIG. 3 or 4, respectively, mounted to a mother board 214A in accordance with one embodiment of the present invention.

As shown in FIG. 5, upper tab(s) 310, body 302 and lower tab(s) 312 define a slot 502. Generally, upper tab(s) 310 lie in a first plane P1 and lower tab(s) 312 lie in a second plane P2, spaced apart and parallel to plane P1. The width of slot 502, e.g., see characteristic A8 of FIG. 8 for example, is equal to or slightly greater than the width WMB of mother board 214A. Accordingly, edge 214E of mother board 214A, e.g., a printed circuit board, fits tightly into slot 502 such that an upper, e.g., first, surface 214U of mother board 214A is supported by upper tab(s) 310 and a lower, e.g., second, surface 214L of mother board 214A is supported by lower tab(s) 312.

Body 302 of mother board retaining bracket 230A (or 230B) is mounted to an outer circuit board housing 232A by screws 504. More particularly, edge 214E of mother board 214A is slid into slot 502 and screws 504 are passed through mounting apertures 304 and are threaded into outer circuit board housing 232A and/or a bolt or other threaded structure in or adjacent outer circuit board housing 232A. In the above manner, edge 214E of mother board 214A is supported in slot 502 thus preventing mother board 214A from moving, e.g., during transportation.

FIG. 6 is a front plan view of mother board retaining bracket 230A of FIG. 3 in accordance with one embodiment of the present invention. In one embodiment, mother board retaining bracket 230A is hard steel, which has been stamped and bent as those of skill in the art will understand. Illustrative specifications for the various characteristics illustrated in FIG. 6 are set forth below in Table 1.

TABLE 1

| CHARACTERISTIC | SPECIFICATION |
| --- | --- |
| A6 | R2.25 mm |
| B6 | 28.00 mm |
| C6 | R1.50 mm |
| D6 | 75.88 mm |
| E6 | 49.12 mm |
| F6 | 12.00 mm |
| G6 | 34.12 mm |
| H6 | 35.00 mm |
| I6 | 7.80 mm |
| J6 | 9.12 mm |
| K6 | 111.76 mm |
| L6 | 140.00 mm |

FIG. 7 is a side plan view of mother board retaining bracket 230A of FIG. 6. An illustrative specification for the various characteristics illustrated in FIG. 7 is set forth below in Table 2.

TABLE 2

| CHARACTERISTIC | SPECIFICATION |
| --- | --- |
| A7 | 40.00 mm |

FIG. 8 is another side plan view of mother board retaining bracket 230A of FIG. 6. Illustrative specifications for the various characteristics illustrated in FIG. 8 are set forth below in Table 3.

TABLE 3

| CHARACTERISTIC | SPECIFICATION |
| --- | --- |
| A8 | 3.00 mm |
| B8 | 2.00 mm |
| C8 | 1.20 mm |

Figure 9:
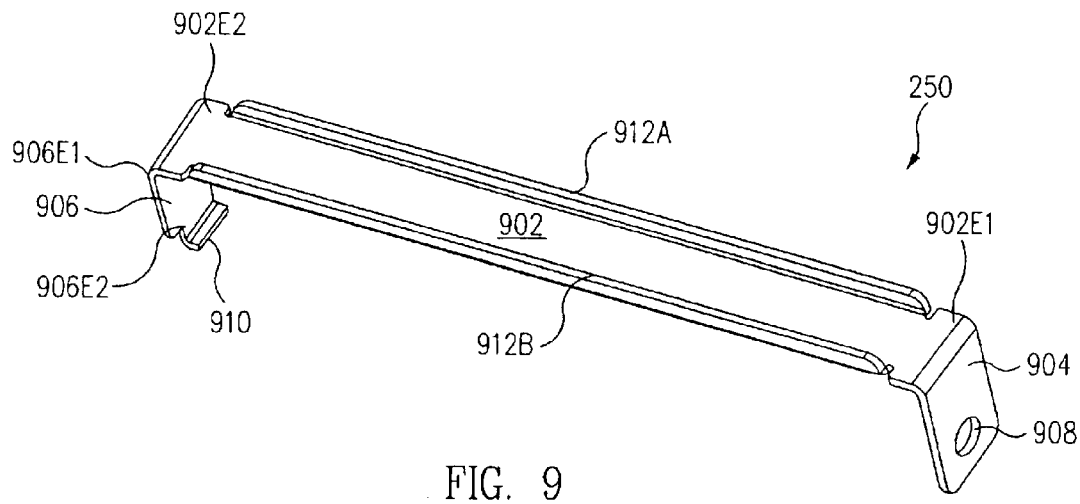
FIG. 9 is a perspective view of a single locker belt retaining bracket in accordance with one embodiment of the present invention.

FIG. 9 is a perspective view of a single locker belt retaining bracket 250 in accordance with one embodiment of the present invention. Single locker belt retaining bracket 250 includes an arm 902, a first extension 904 attached to a first end 902E1 of arm 902 and a second extension 906 attached to a second end 902E2 of arm 902 opposite first end 902E1. In this embodiment, extensions 904, 906 extend perpendicularly from arm 902. Illustratively, the distance between extension 904 and extension 906 is 106.00 mm. In one embodiment, single locker belt retaining bracket 250 is hard steel, which has been stamped and bent as those of skill in the art will understand.

Extension 904 includes a mounting aperture 908, illustratively, having a specification of R2.50 mm. A first end 906E1 of extension 906 is attached to arm 902. A tab 910 extends perpendicularly from, and is attached to, a second end 906E2 of extension 906 opposite end 906E1. Tab 910 is parallel to arm 902. As discussed below in greater detail with reference to FIG. 10, mounting aperture 908 and tab 910 facilitate mounting of single locker belt retaining bracket 250 to the circuit board housings.

Rails 912A, 912B are along the length of arm 902 and extend perpendicularly from arm 902. Rails 912A, 912B provide strength and rigidity of arm 902.

Figure 10:
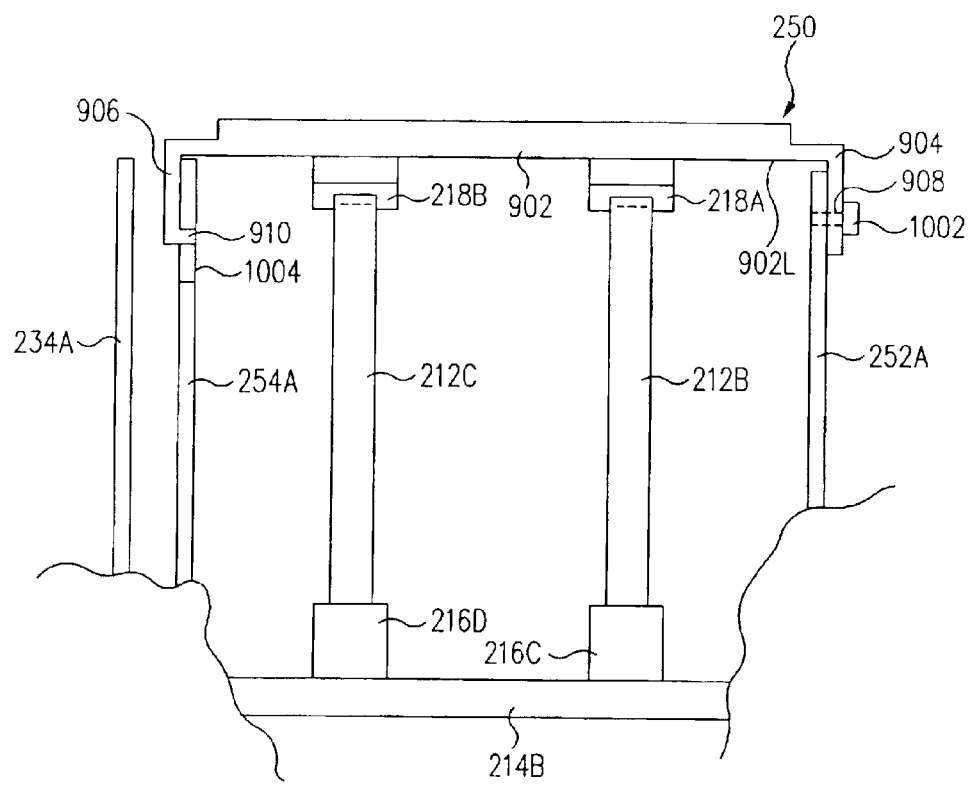
FIG. 10 is a side plan view of the single locker belt retaining bracket of FIG. 9 mounted across retaining clips in accordance with one embodiment of the present invention.

FIG. 10 is a side plan view of single locker belt retaining bracket 250 of FIG. 9 mounted across retaining clips 218A, 218B in accordance with one embodiment of the present invention. As shown in FIG. 10, circuit boards 212B, 212C are mounted in sockets 216C, 216D, respectively, of a mother board 214B. Circuit boards 212B, 212C include retaining clips 218A, 218B, respectively.

Single locker belt retaining bracket 250 is mounted to an inner circuit board housing 254A and an outer circuit board housing 252A. More particularly, extension 904 is mounted to outer circuit board housing 252A by a screw 1002 passing through mounting aperture 908 of extension 904 and being threaded into outer circuit board housing 252A and/or a bolt or other threaded structure in or adjacent outer circuit board housing 252A. Further, extension 906 is mounted to inner circuit board housing 254A by tab 910, which is located in a slot 1004 in inner circuit board housing 254A.

Advantageously, arm 902 contacts and locks in place retaining clips 218A, 218B. In this manner, single locker belt retaining bracket 250 prevents retaining clips 218A, 218B from becoming shook loose, e.g., during transportation, and prevents the associated failure of computer system 200.

In one embodiment, arm 902 includes a compliant pad on a lower, e.g., first, surface 902L of arm 902 and this compliant pad contacts retaining clips 218A, 218B. An example of a suitable compliant pad is an adhesive back silicon pad such as a 10 mm×90 mm×2.5 mm thick medium silicon pad available from Boyd Corporation, 600 South McClure Road, Modesto, Calif. 95357, (209) 236-1111 as part number R10460.

Of importance, tab 910 in combination with slot 1004 allow single locker belt retaining bracket 250 to be easily installed and removed. Typically, inner circuit board housing 254A is directly adjacent a second inner circuit board housing 234A and the space between inner circuit board housings 254A and 234A is relatively small. However, to mount single locker belt retaining bracket 250 to inner circuit board housing 254A, tab 910 is simply moved and snapped or otherwise placed into slot 1004. Advantageously, mechanical manipulation of a screw or other mounting structure within the small space between inner circuit board housings 254A and 234A is avoided.

After tab 910 is placed in slot 1004, screw 1002 is passed through mounting aperture 908 and is threaded into outer circuit board housing 252A and/or a bolt or other threaded structure in or adjacent outer circuit board housing 252A. Of importance, ample space for manipulation of screw 1002 is typically available.

Figure 11:
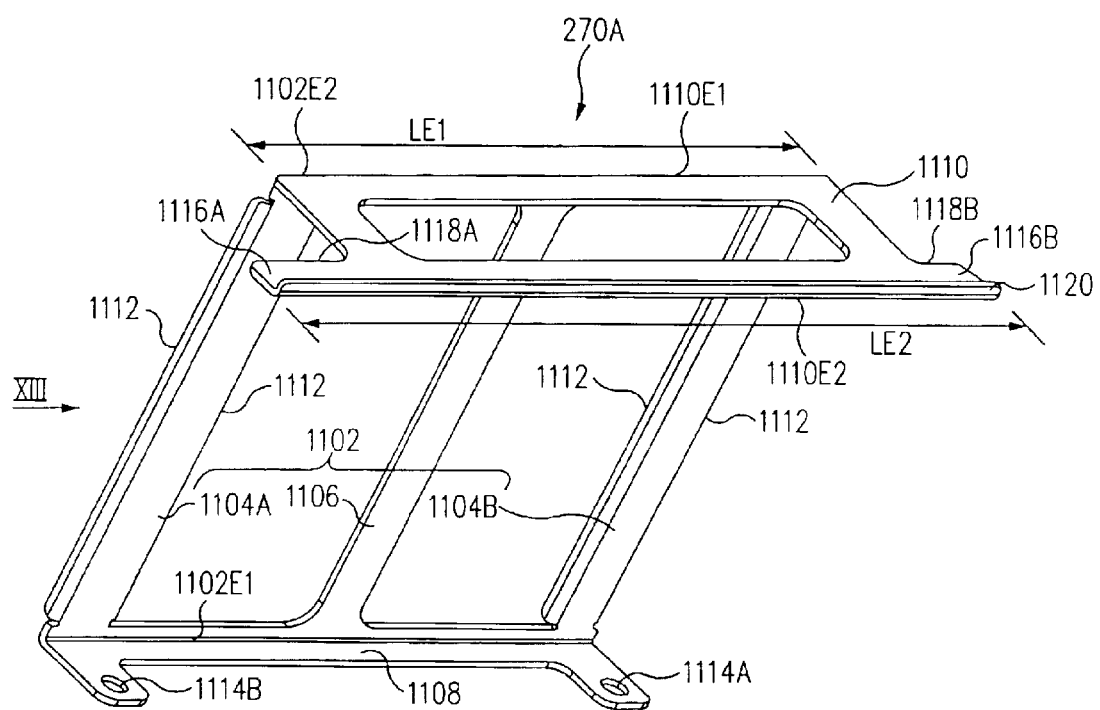
FIG. 11 is a perspective view of a double locker belt retaining bracket in accordance with one embodiment of the present invention.

FIG. 11 is a perspective view of a double locker belt retaining bracket 270A in accordance with one embodiment of the present invention. Double locker belt retaining bracket 270A includes a body 1102, a first extension 1108 attached to a first end 1102E1 of body 1102 and a second extension 1110 attached to a second end 1102E2 of body 1102 opposite first end 1102E1. In this embodiment, extensions 1108, 1110 extend perpendicularly from body 1102. Extension 1108 includes a first mounting aperture 1114A and a second mounting aperture 1114B, collectively referred to as mounting apertures 1114. In one embodiment, double locker belt retaining bracket 270A is hard steel, which has been stamped and bent as those of skill in the art will understand.

Body 1102 includes a first arm 1104A, a second arm 1104B and a support beam 1106 integrally attached together at ends 1102E1, 1102E2 of body 1102. Rails 1112 are along the lengths of arms 1104A, 1104B and extend perpendicularly from arms 1104A, 1104B. More particularly, each of arms 1104A, 1104B includes two of rails 1112. Rails 1112 provide strength and rigidity to arms 1104.

A first end 1110E1 of extension 1110 is attached to body 1102. Of importance, a second end 1110E2 of extension 1110 is flared to have a greater length LE2 than a length LE1 of first end 111E1. Stated another way, extension 1110 includes protrusions 1116A, 1116B, opposite one another, at second end 1110E2. Protrusions 1116A, 1116B define lips 1118A, 1118B, respectively. Protrusions 1116A, 1116B and lips 1118A, 1118B collectively are referred to as protrusions 1116 and lips 1118, respectively. In this embodiment, lips 1118 are parallel to body 1102. A rail 1120 is along the length of second end 1110E2 and extends perpendicularly from extension 1110. Rail 1120 provides strength and rigidity of extension 1110.

Figure 12:
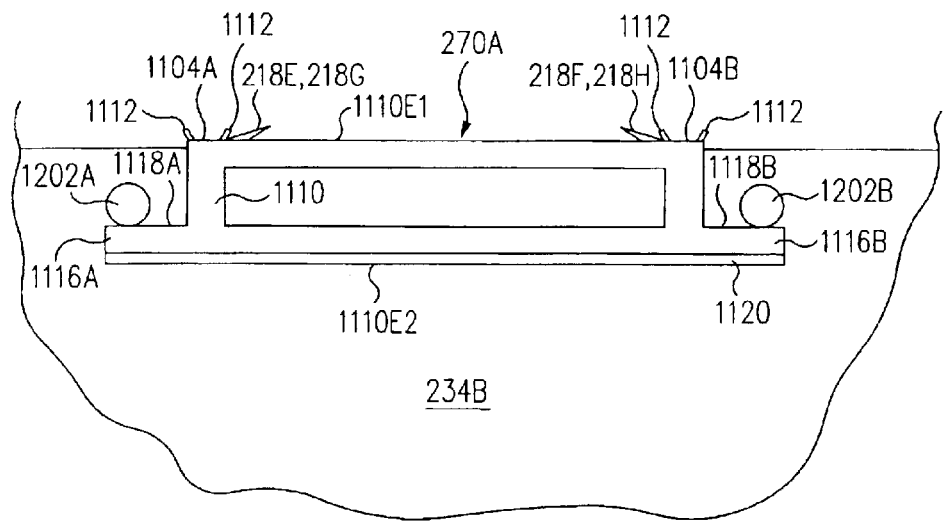
FIG. 12 is a side plan view of the double locker belt retaining bracket of FIG. 11 mounted across retaining clips in accordance with one embodiment of the present invention.
Figure 13:
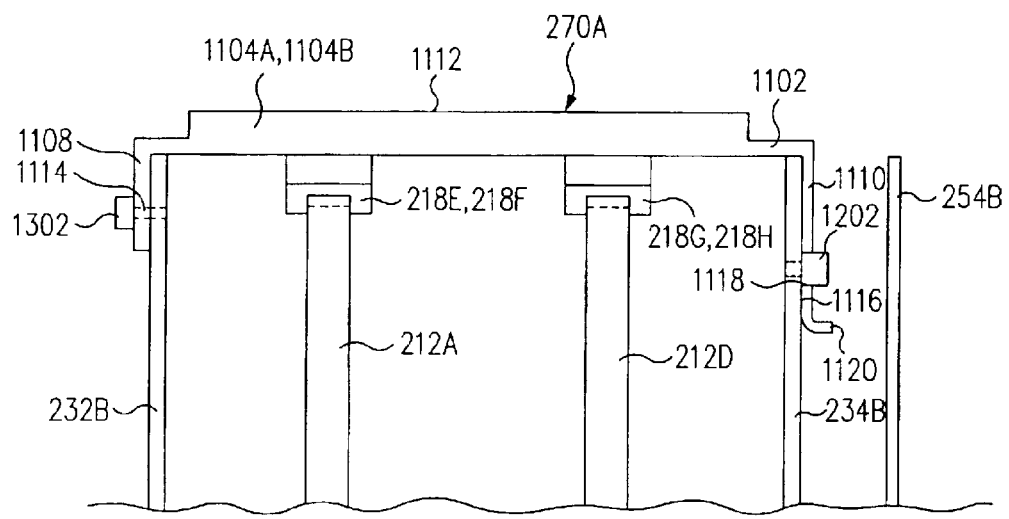
FIG. 13 is a front plan view of the double locker belt retaining bracket mounted across the retaining clips of FIG. 12.

FIG. 12 is a side plan view of double locker belt retaining bracket 270A of FIG. 11 mounted across retaining clips 218E, 218F, 218G, 218H in accordance with one embodiment of the present invention. FIG. 13 is a front plan view of double locker belt retaining bracket 270A mounted across retaining clips 218E, 218F, 218G, 218H of FIG. 12.

Referring now to FIGS. 12 and 13 together, double locker belt retaining bracket 270A is mounted to an inner circuit board housing 234B and an outer circuit board housing 232B. More particularly, extension 1108 is mounted to outer circuit board housing 232B by screws 1302 passing through mounting apertures 1114 of extension 1108, which are threaded into outer circuit board housing 232B and/or a bolt or other threaded structure in or adjacent outer circuit board housing 232B. Further, extension 1110 is mounted to inner circuit board housing 234B by protrusions 1116A, 1116B, which are positioned below mounting studs 1202A, 1202B, respectively, extending from inner circuit board housing 234B.

Advantageously, arm 1104A contacts and locks in place retaining clips 218E, 218G of circuit boards 212A, 212D, respectively. Similarly, arm 1104B contacts and locks in place retaining clips 218F, 218H of circuit boards 212A, 212D, respectively. In this manner, double locker belt retaining bracket 270A prevents retaining clips 218E, 218F, 218G, 218H from becoming shook loose, e.g., during transportation, and prevents the associated failure of computer system 200.

Of importance, protrusions 1116A, 1116B in combination with mounting studs 1202A, 1202B allow double locker belt retaining bracket 270A to be easily installed and removed. Typically, inner circuit board housing 234B is directly adjacent a second inner circuit board housing 254B and the space between inner circuit board housings 234B and 254B is relatively small.

To allow double locker belt retaining bracket 270A to be easily installed and removed, mounting studs 1202A, 1202B are attached to inner circuit board housing 234B. Illustratively, mounting studs 1202A, 1202B are pegs, washers and/or screw heads mounted to inner circuit board housing 234B.

Referring now to FIG. 12, to mount double locker belt retaining bracket 270A to inner circuit board housing 234B, protrusion 1116A (or 1116B) is passed around and below mounting stud 1202A (or 1202B). Double locker belt retaining bracket 270A is slid horizontally left towards mounting stud 1202A (or right towards mounting stud 1202B) in the view of FIG. 12 until extension 1110 is wedged against mounting stud 1202A (or 1202B) preventing any further motion of double locker belt retaining bracket 270A.

Protrusion 1116B (or 1116A) is then passed down around mounting stud 1202B (or 1202A). Double locker belt retaining bracket 270A is slid horizontally right towards mounting stud 1202B (or left towards mounting stud 1202A) such that lips 1118A, 1118B engage mounting studs 1202A, 1202B, respectively. Referring again to FIGS. 12 and 13 together, mechanical manipulation of a screw or other mounting structure within the small space between inner circuit board housings 234B and 254B is avoided.

After lips 1118A, 1118B are engaged with mounting studs 1202A, 1202B, respectively, screws 1302 (FIG. 13) are passed through mounting apertures 1114 and are threaded into outer circuit board housing 232B and/or a bolt or other threaded structure in or adjacent outer circuit board housing 232B. Of importance, ample space for manipulation of screws 1302 is typically available.

Figure 14:
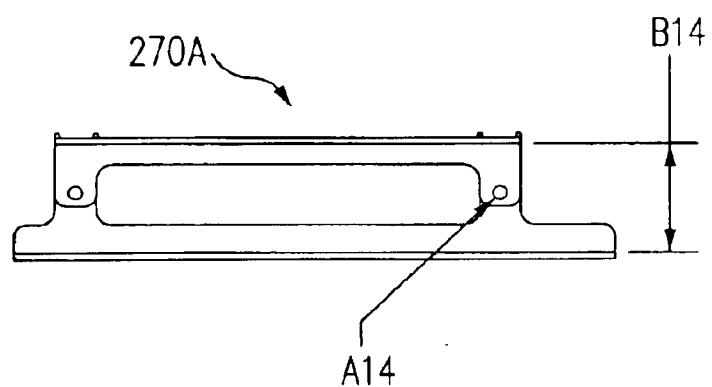
FIG. 14 is a side plan view of the double locker belt retaining bracket of FIG. 11.

FIG. 14 is a side plan view of double locker belt retaining bracket 270A of FIG. 11. Illustrative specifications for the various characteristics illustrated in FIG. 14 are set forth below in Table 4.

TABLE 4

| CHARACTERISTIC | SPECIFICATION |
| --- | --- |
| A14 | R2.50 mm |
| B14 | 31.30 mm |

Figure 15:
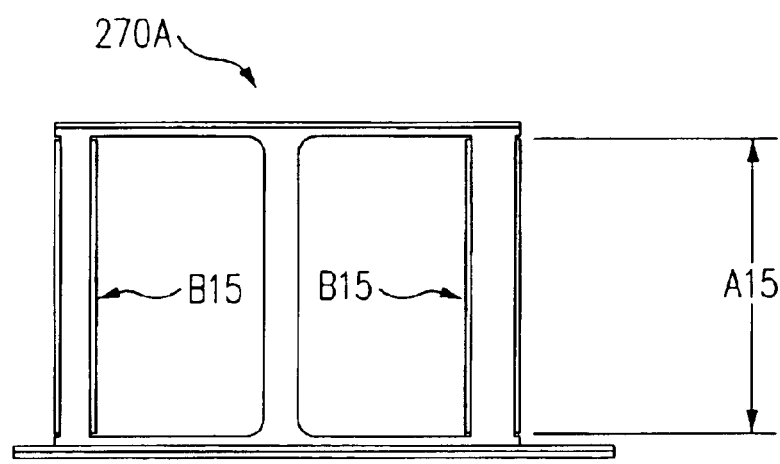
FIG. 15 is a top plan view of the double locker belt retaining bracket of FIG. 11.

FIG. 15 is a top plan view of double locker belt retaining bracket 270A of FIG. 11. Illustrative specifications for the various characteristics illustrated in FIG. 15 are set forth below in Table 5.

TABLE 5

| CHARACTERISTIC | SPECIFICATION |
| --- | --- |
| A15 | 85.40 mm |
| B15 | Apply Boyd adhesive backed medium silicon (Boyd part number R10460), size 10 mm × 90 mm × 2.4 mm thick, to underside surface. |

The drawings and the forgoing description gave examples of the present invention. The scope of the present invention, however, is by no means limited by these specific examples.

Numerous variations, whether explicitly given in the specification or not, such as differences in structure, dimension, and use of material, are possible. For example, although the terms parallel and perpendicular are used in relation to various structures, it is understood that the various structures may not be exactly parallel or perpendicular but only substantially parallel or perpendicular. The scope of the invention is at least as broad as given by the following claims.

I claim:

1. A structure comprising:

a retaining bracket, said retaining bracket comprising:
      an arm;
      a first extension attached to a first end of said arm, said first extension comprising a mounting aperture;
      a second extension having a first end attached to a second end of said arm; and
      a tab attached to a second end of said second extension;

a circuit board having a retaining clip, said arm contacting and locking in place said retaining clip;

a first circuit board housing; and a second circuit board housing, said retaining bracket being mounted to said first circuit board housing and said second circuit board housing.

2. The structure of claim 1 wherein said first extension is perpendicular to said arm and said second extension is perpendicular to said arm.

3. The structure of claim 1 further comprising a rail along a length of said arm and extending perpendicularly from said arm.

4. The structure of claim 1 wherein said first circuit board housing comprises a slot, said second extension being mounted to said first circuit board housing by locating said tan in said slot.

5. The structure of claim 1 wherein said mounting aperture is for mounting of said retaining bracket to said second circuit board housing.

6. The structure of claim 1 further comprising a screw passing through said mounting aperture.

7. The structure of claim 1 wherein said retaining bracket further comprises a compliant pad on a first surface of said arm.

8. The structure of claim 2 wherein said tab is perpendicular to said second extension and parallel to said arm.

9. The structure of claim 3 wherein said rail provides strength and rigidity of said arm.

10. The structure of claim 4 further comprising a screw, said first extension being mounted to said second circuit board housing by said screw, said screw passing through said mounting aperture and being threading into a threaded structure in or adjacent said second circuit board housing.

* * * * *